US007236422B2

(12) United States Patent
Kageyama et al.

(10) Patent No.: US 7,236,422 B2
(45) Date of Patent: Jun. 26, 2007

(54) IMAGE DISPLAY DEVICE AND THE DRIVER CIRCUIT THEREOF

(75) Inventors: Hiroshi Kageyama, Hachioji (JP); Mitsuhide Miyamoto, Kokubunji (JP); Hajime Akimoto, Kokubunji (JP)

(73) Assignee: Hitachi Displays, Ltd., Chiba-ken (JP)

( * ) Notice: Subject to any disclaimer, the term of this patent is extended or adjusted under 35 U.S.C. 154(b) by 0 days.

(21) Appl. No.: 11/274,201

(22) Filed: Nov. 16, 2005

(65) Prior Publication Data

US 2006/0120203 A1 Jun. 8, 2006

(30) Foreign Application Priority Data

Nov. 22, 2004 (JP) ............................ 2004-336950

(51) Int. Cl.
*G11C 8/00* (2006.01)

(52) U.S. Cl. ............................ 365/230.06; 365/189.12

(58) Field of Classification Search ........... 365/230.06, 365/189.12, 240
See application file for complete search history.

(56) References Cited

U.S. PATENT DOCUMENTS 6,989,844 B2 * 1/2006 Kageyama et al. ......... 345/690
2004/0100436 A1 * 5/2004 Maeda et al. ............... 345/100

FOREIGN PATENT DOCUMENTS

JP 2003-5716 6/2001
JP 2004-85666 8/2002

* cited by examiner

*Primary Examiner*—Anh Phung
(74) *Attorney, Agent, or Firm*—Reed Smith LLP; Stanley P. Fisher, Esq.; Juan Carlos A. Marquez, Esq.

(57) ABSTRACT

A data driver circuit which enables the square measure of the non-display areas of image display devices to be reduced is to be provided. The driver circuit has two DA converters which convert the digital signals, in accordance with more significant bits thereof, into analog voltages; a voltage divider which divides the output voltages of the two DA converters in accordance with less significant bits of the signals; and a shift register which generates trigger signals in synchronism with the digital signals. The voltage divider, arranged in the gap between the two DA converters, comprises memory elements arrayed in two-dimensional matrixes, and a plurality of resistive wirings. The memory elements store decoded signals generated by the decoders in synchronism with the trigger signals, and selectively supply, in accordance with the decoded signals stored by the memory elements, the divided voltages which derive from the two DA converters and are generated on the resistive wirings.

10 Claims, 12 Drawing Sheets

FIG. 3

DEC1

| INPUT | | | | OUTPUT | | | | | | | | |
|---|---|---|---|---|---|---|---|---|---|---|---|---|
| b7 | b6 | b5 | b4 | D0 | D1 | D2 | D3 | D4 | D5 | D6 | D7 | D8 |
| 0 | 0 | 0 | 0 | H | L | L | L | L | L | L | L | L |
| 0 | 0 | 0 | 1 | L | H | L | L | L | L | L | L | L |
| 0 | 0 | 1 | 0 | L | H | L | L | L | L | L | L | L |
| 0 | 0 | 1 | 1 | L | L | H | L | L | L | L | L | L |
| 0 | 1 | 0 | 0 | L | L | H | L | L | L | L | L | L |
| 0 | 1 | 0 | 1 | L | L | L | H | L | L | L | L | L |
| 0 | 1 | 1 | 0 | L | L | L | H | L | L | L | L | L |
| 0 | 1 | 1 | 1 | L | L | L | L | H | L | L | L | L |
| 1 | 0 | 0 | 0 | L | L | L | L | H | L | L | L | L |
| 1 | 0 | 0 | 1 | L | L | L | L | L | H | L | L | L |
| 1 | 0 | 1 | 0 | L | L | L | L | L | H | L | L | L |
| 1 | 0 | 1 | 1 | L | L | L | L | L | L | H | L | L |
| 1 | 1 | 0 | 0 | L | L | L | L | L | L | H | L | L |
| 1 | 1 | 0 | 1 | L | L | L | L | L | L | L | H | L |
| 1 | 1 | 1 | 0 | L | L | L | L | L | L | L | H | L |
| 1 | 1 | 1 | 1 | L | L | L | L | L | L | L | L | H |

FIG. 4

DEC2

| INPUT | | | OUTPUT | | | | | | | |
|---|---|---|---|---|---|---|---|---|---|---|
| b7 | b6 | b5 | E0 | E1 | E2 | E3 | E4 | E5 | E6 | E7 |
| 0 | 0 | 0 | H | L | L | L | L | L | L | L |
| 0 | 0 | 1 | L | H | L | L | L | L | L | L |
| 0 | 1 | 0 | L | L | H | L | L | L | L | L |
| 0 | 1 | 1 | L | L | L | H | L | L | L | L |
| 1 | 0 | 0 | L | L | L | L | H | L | L | L |
| 1 | 0 | 1 | L | L | L | L | L | H | L | L |
| 1 | 1 | 0 | L | L | L | L | L | L | H | L |
| 1 | 1 | 1 | L | L | L | L | L | L | L | H |

FIG. 5

DEC3

| INPUT | | | | | OUTPUT | | | | | | | | | | | | | | | | |
|---|---|---|---|---|---|---|---|---|---|---|---|---|---|---|---|---|---|---|---|---|---|
| b4 | b3 | b2 | b1 | b0 | F0 | F1 | F2 | F3 | F4 | F5 | F6 | F7 | F8 | F9 | F10 | F11 | F12 | F13 | F14 | F15 | F16 |
| 0 | 0 | 0 | 0 | 0 | H | L | L | L | L | L | L | L | L | L | L | L | L | L | L | L | L |
| 0 | 0 | 0 | 0 | 1 | L | H | L | L | L | L | L | L | L | L | L | L | L | L | L | L | L |
| 0 | 0 | 0 | 1 | 0 | L | L | H | L | L | L | L | L | L | L | L | L | L | L | L | L | L |
| 0 | 0 | 0 | 1 | 1 | L | L | L | H | L | L | L | L | L | L | L | L | L | L | L | L | L |
| 0 | 0 | 1 | 0 | 0 | L | L | L | L | H | L | L | L | L | L | L | L | L | L | L | L | L |
| 0 | 0 | 1 | 0 | 1 | L | L | L | L | L | H | L | L | L | L | L | L | L | L | L | L | L |
| 0 | 0 | 1 | 1 | 0 | L | L | L | L | L | L | H | L | L | L | L | L | L | L | L | L | L |
| 0 | 0 | 1 | 1 | 1 | L | L | L | L | L | L | L | H | L | L | L | L | L | L | L | L | L |
| 0 | 1 | 0 | 0 | 0 | L | L | L | L | L | L | L | L | H | L | L | L | L | L | L | L | L |
| 0 | 1 | 0 | 0 | 1 | L | L | L | L | L | L | L | L | L | H | L | L | L | L | L | L | L |
| 0 | 1 | 0 | 1 | 0 | L | L | L | L | L | L | L | L | L | L | H | L | L | L | L | L | L |
| 0 | 1 | 0 | 1 | 1 | L | L | L | L | L | L | L | L | L | L | L | H | L | L | L | L | L |
| 0 | 1 | 1 | 0 | 0 | L | L | L | L | L | L | L | L | L | L | L | L | H | L | L | L | L |
| 0 | 1 | 1 | 0 | 1 | L | L | L | L | L | L | L | L | L | L | L | L | L | H | L | L | L |
| 0 | 1 | 1 | 1 | 0 | L | L | L | L | L | L | L | L | L | L | L | L | L | L | H | L | L |
| 0 | 1 | 1 | 1 | 1 | L | L | L | L | L | L | L | L | L | L | L | L | L | L | L | H | L |
| 1 | 0 | 0 | 0 | 0 | L | L | L | L | L | L | L | L | L | L | L | L | L | L | L | L | H |
| 1 | 0 | 0 | 0 | 1 | L | L | L | L | L | L | L | L | L | L | L | L | L | L | L | H | L |
| 1 | 0 | 0 | 1 | 0 | L | L | L | L | L | L | L | L | L | L | L | L | L | L | H | L | L |
| 1 | 0 | 0 | 1 | 1 | L | L | L | L | L | L | L | L | L | L | L | L | L | H | L | L | L |
| 1 | 0 | 1 | 0 | 0 | L | L | L | L | L | L | L | L | L | L | L | L | H | L | L | L | L |
| 1 | 0 | 1 | 0 | 1 | L | L | L | L | L | L | L | L | L | L | L | H | L | L | L | L | L |
| 1 | 0 | 1 | 1 | 0 | L | L | L | L | L | L | L | L | L | L | H | L | L | L | L | L | L |
| 1 | 0 | 1 | 1 | 1 | L | L | L | L | L | L | L | L | L | H | L | L | L | L | L | L | L |
| 1 | 1 | 0 | 0 | 0 | L | L | L | L | L | L | L | L | H | L | L | L | L | L | L | L | L |
| 1 | 1 | 0 | 0 | 1 | L | L | L | L | L | L | L | H | L | L | L | L | L | L | L | L | L |
| 1 | 1 | 0 | 1 | 0 | L | L | L | L | L | L | H | L | L | L | L | L | L | L | L | L | L |
| 1 | 1 | 0 | 1 | 1 | L | L | L | L | L | H | L | L | L | L | L | L | L | L | L | L | L |
| 1 | 1 | 1 | 0 | 0 | L | L | L | L | H | L | L | L | L | L | L | L | L | L | L | L | L |
| 1 | 1 | 1 | 0 | 1 | L | L | L | H | L | L | L | L | L | L | L | L | L | L | L | L | L |
| 1 | 1 | 1 | 1 | 0 | L | L | H | L | L | L | L | L | L | L | L | L | L | L | L | L | L |
| 1 | 1 | 1 | 1 | 1 | L | H | L | L | L | L | L | L | L | L | L | L | L | L | L | L | L |

FIG. 6A

| DSIG | D0 | D1 | D2 | D3 | D4 | D5 | D6 | D7 | D8 | F0 | F1 | F2 | F3 | F4 | F5 | F6 | F7 | F8 | F9 | F10 | F11 | F12 | F13 | F14 | F15 | F16 | | E1 | E2 | E3 | E4 | E5 | E6 | E7 | E8 | Vout (Y1 - Yn) |
|---|---|---|---|---|---|---|---|---|---|---|---|---|---|---|---|---|---|---|---|---|---|---|---|---|---|---|---|---|---|---|---|---|---|---|---|---|
| 00 | H | L | L | L | L | L | L | L | L | H | L | L | L | L | L | L | L | L | L | L | L | L | L | L | L | L | | L | L | L | L | L | L | L | L | V0 |
| 01 | H | L | L | L | L | L | L | L | L | L | H | L | L | L | L | L | L | L | L | L | L | L | L | L | L | L | | H | L | L | L | L | L | L | L | (15/16)V0+(1/16)V1 |
| 02 | H | L | L | L | L | L | L | L | L | L | L | H | L | L | L | L | L | L | L | L | L | L | L | L | L | L | | H | L | L | L | L | L | L | L | (14/16)V0+(2/16)V1 |
| 03 | H | L | L | L | L | L | L | L | L | L | L | L | H | L | L | L | L | L | L | L | L | L | L | L | L | L | | H | L | L | L | L | L | L | L | (13/16)V0+(3/16)V1 |
| 04 | H | L | L | L | L | L | L | L | L | L | L | L | L | H | L | L | L | L | L | L | L | L | L | L | L | L | | H | L | L | L | L | L | L | L | (12/16)V0+(4/16)V1 |
| 05 | H | L | L | L | L | L | L | L | L | L | L | L | L | L | H | L | L | L | L | L | L | L | L | L | L | L | | H | L | L | L | L | L | L | L | (11/16)V0+(5/16)V1 |
| 06 | H | L | L | L | L | L | L | L | L | L | L | L | L | L | L | H | L | L | L | L | L | L | L | L | L | L | | H | L | L | L | L | L | L | L | (10/16)V0+(6/16)V1 |
| 07 | H | L | L | L | L | L | L | L | L | L | L | L | L | L | L | L | H | L | L | L | L | L | L | L | L | L | | H | L | L | L | L | L | L | L | (9/16)V0+(7/16)V1 |
| 08 | H | L | L | L | L | L | L | L | L | L | L | L | L | L | L | L | L | H | L | L | L | L | L | L | L | L | #1 | H | L | L | L | L | L | L | L | (8/16)V0+(8/16)V1 |
| 09 | H | L | L | L | L | L | L | L | L | L | L | L | L | L | L | L | L | L | H | L | L | L | L | L | L | L | | H | L | L | L | L | L | L | L | (7/16)V0+(9/16)V1 |
| 0A | H | L | L | L | L | L | L | L | L | L | L | L | L | L | L | L | L | L | L | H | L | L | L | L | L | L | | H | L | L | L | L | L | L | L | (6/16)V0+(10/16)V1 |
| 0B | H | L | L | L | L | L | L | L | L | L | L | L | L | L | L | L | L | L | L | L | H | L | L | L | L | L | | H | L | L | L | L | L | L | L | (5/16)V0+(11/16)V1 |
| 0C | H | L | L | L | L | L | L | L | L | L | L | L | L | L | L | L | L | L | L | L | L | H | L | L | L | L | | H | L | L | L | L | L | L | L | (4/16)V0+(12/16)V1 |
| 0D | H | L | L | L | L | L | L | L | L | L | L | L | L | L | L | L | L | L | L | L | L | L | H | L | L | L | | H | L | L | L | L | L | L | L | (3/16)V0+(13/16)V1 |
| 0E | H | L | L | L | L | L | L | L | L | L | L | L | L | L | L | L | L | L | L | L | L | L | L | H | L | L | | H | L | L | L | L | L | L | L | (2/16)V0+(14/16)V1 |
| 0F | H | L | L | L | L | L | L | L | L | L | L | L | L | L | L | L | L | L | L | L | L | L | L | L | H | L | | H | L | L | L | L | L | L | L | (1/16)V0+(15/16)V1 |
| 10 | L | H | L | L | L | L | L | L | L | L | L | L | L | L | L | L | L | L | L | L | L | L | L | L | L | H | | H | L | L | L | L | L | L | L | V1 |
| 11 | L | H | L | L | L | L | L | L | L | L | L | L | L | L | L | L | L | L | L | L | L | L | L | L | H | L | | H | L | L | L | L | L | L | L | (15/16)V1+(1/16)V2 |
| 12 | L | H | L | L | L | L | L | L | L | L | L | L | L | L | L | L | L | L | L | L | L | L | L | H | L | L | | H | L | L | L | L | L | L | L | (14/16)V1+(2/16)V2 |
| 13 | L | H | L | L | L | L | L | L | L | L | L | L | L | L | L | L | L | L | L | L | L | L | H | L | L | L | | H | L | L | L | L | L | L | L | (13/16)V1+(3/16)V2 |
| 14 | L | H | L | L | L | L | L | L | L | L | L | L | L | L | L | L | L | L | L | L | L | H | L | L | L | L | | H | L | L | L | L | L | L | L | (12/16)V1+(4/16)V2 |
| 15 | L | H | L | L | L | L | L | L | L | L | L | L | L | L | L | L | L | L | L | L | H | L | L | L | L | L | | H | L | L | L | L | L | L | L | (11/16)V1+(5/16)V2 |
| 16 | L | H | L | L | L | L | L | L | L | L | L | L | L | L | L | L | L | L | L | H | L | L | L | L | L | L | | H | L | L | L | L | L | L | L | (10/16)V1+(6/16)V2 |
| 17 | L | H | L | L | L | L | L | L | L | L | L | L | L | L | L | L | L | L | H | L | L | L | L | L | L | L | | H | L | L | L | L | L | L | L | (9/16)V1+(7/16)V2 |
| 18 | L | H | L | L | L | L | L | L | L | L | L | L | L | L | L | L | L | H | L | L | L | L | L | L | L | L | #2 | H | L | L | L | L | L | L | L | (8/16)V1+(8/16)V2 |
| 19 | L | H | L | L | L | L | L | L | L | L | L | L | L | L | L | L | H | L | L | L | L | L | L | L | L | L | | H | L | L | L | L | L | L | L | (7/16)V1+(9/16)V2 |
| 1A | L | H | L | L | L | L | L | L | L | L | L | L | L | L | L | H | L | L | L | L | L | L | L | L | L | L | | H | L | L | L | L | L | L | L | (6/16)V1+(10/16)V2 |
| 1B | L | H | L | L | L | L | L | L | L | L | L | L | L | L | H | L | L | L | L | L | L | L | L | L | L | L | | H | L | L | L | L | L | L | L | (5/16)V1+(11/16)V2 |
| 1C | L | H | L | L | L | L | L | L | L | L | L | L | L | H | L | L | L | L | L | L | L | L | L | L | L | L | | H | L | L | L | L | L | L | L | (4/16)V1+(12/16)V2 |
| 1D | L | H | L | L | L | L | L | L | L | L | L | L | H | L | L | L | L | L | L | L | L | L | L | L | L | L | | H | L | L | L | L | L | L | L | (3/16)V1+(13/16)V2 |
| 1E | L | H | L | L | L | L | L | L | L | L | L | H | L | L | L | L | L | L | L | L | L | L | L | L | L | L | | H | L | L | L | L | L | L | L | (2/16)V1+(14/16)V2 |
| 1F | L | H | L | L | L | L | L | L | L | L | H | L | L | L | L | L | L | L | L | L | L | L | L | L | L | L | | H | L | L | L | L | L | L | L | (1/16)V1+(15/16)V2 |

FIG. 6B

| DSIG | D0 | D1 | D2 | D3 | D4 | D5 | D6 | D7 | D8 | F0 | F1 | F2 | F3 | F4 | F5 | F6 | F7 | F8 | F9 | F10 | F11 | F12 | F13 | F14 | F15 | F16 | | E1 | E2 | E3 | E4 | E5 | E6 | E7 | E8 | Vout (Y1 - Yn) |
|---|---|---|---|---|---|---|---|---|---|---|---|---|---|---|---|---|---|---|---|---|---|---|---|---|---|---|---|---|---|---|---|---|---|---|---|---|
| 20 | L | H | L | L | L | L | L | L | L | H | L | L | L | L | L | L | L | L | L | L | L | L | L | L | L | L | | H | L | L | L | L | L | L | L | V2 |
| 21 - 2F | L | H | L | L | L | L | L | L | L | | | | | | | | | | | | | | | | | | REP.#1 | L | H | L | L | L | L | L | L | V2 < Vout < V3 |
| 30 | L | L | H | L | L | L | L | L | L | L | L | L | L | L | L | L | L | L | L | L | L | L | L | L | L | H | | L | H | L | L | L | L | L | L | V3 |
| 31 - 3F | L | L | H | L | L | L | L | L | L | | | | | | | | | | | | | | | | | | REP.#2 | L | H | L | L | L | L | L | L | V3 < Vout < V4 |
| 40 | L | L | H | L | L | L | L | L | L | H | L | L | L | L | L | L | L | L | L | L | L | L | L | L | L | L | | L | H | L | L | L | L | L | L | V4 |
| 41 - 4F | L | L | H | L | L | L | L | L | L | | | | | | | | | | | | | | | | | | REP.#1 | L | L | H | L | L | L | L | L | V4 < Vout < V5 |
| 50 | L | L | L | H | L | L | L | L | L | L | L | L | L | L | L | L | L | L | L | L | L | L | L | L | L | H | | L | L | H | L | L | L | L | L | V5 |
| 51 - 5F | L | L | L | H | L | L | L | L | L | | | | | | | | | | | | | | | | | | REP.#2 | L | L | H | L | L | L | L | L | V5 < Vout < V6 |
| 60 | L | L | L | H | L | L | L | L | L | H | L | L | L | L | L | L | L | L | L | L | L | L | L | L | L | L | | L | L | H | L | L | L | L | L | V6 |
| 61 - 6F | L | L | L | H | L | L | L | L | L | | | | | | | | | | | | | | | | | | REP.#1 | L | L | L | H | L | L | L | L | V6 < Vout < V7 |
| 70 | L | L | L | H | L | L | L | L | L | L | L | L | L | L | L | L | L | L | L | L | L | L | L | L | L | H | | L | L | L | H | L | L | L | L | V7 |
| 71 - 7F | L | L | L | L | H | L | L | L | L | | | | | | | | | | | | | | | | | | REP.#2 | L | L | L | H | L | L | L | L | V7 < Vout < V8 |
| 80 | L | L | L | L | H | L | L | L | L | H | L | L | L | L | L | L | L | L | L | L | L | L | L | L | L | L | | L | L | L | H | L | L | L | L | V8 |
| 81 - 8F | L | L | L | L | H | L | L | L | L | | | | | | | | | | | | | | | | | | REP.#1 | L | L | L | L | H | L | L | L | V8 < Vout < V9 |
| 90 | L | L | L | L | H | L | L | L | L | L | L | L | L | L | L | L | L | L | L | L | L | L | L | L | L | H | | L | L | L | L | H | L | L | L | V9 |
| 91 - 9F | L | L | L | L | L | H | L | L | L | | | | | | | | | | | | | | | | | | REP.#2 | L | L | L | L | H | L | L | L | V9 < Vout < V10 |
| A0 | L | H | L | L | L | H | L | L | L | H | L | L | L | L | L | L | L | L | L | L | L | L | L | L | L | L | | L | L | L | L | H | L | L | L | V10 |
| A1 - AF | L | H | L | L | L | H | L | L | L | | | | | | | | | | | | | | | | | | REP.#1 | L | L | L | L | L | H | L | L | V10 < Vout < V11 |
| B0 | L | H | L | L | L | H | L | L | L | L | L | L | L | L | L | L | L | L | L | L | L | L | L | L | L | H | | L | L | L | L | L | H | L | L | V11 |
| B1 - BF | L | H | L | L | L | L | H | L | L | | | | | | | | | | | | | | | | | | REP.#2 | L | L | L | L | L | H | L | L | V11 < Vout < V12 |
| C0 | L | H | L | L | L | L | H | L | L | H | L | L | L | L | L | L | L | L | L | L | L | L | L | L | L | L | | L | L | L | L | L | H | L | L | V12 |
| C1 - CF | L | H | L | L | L | L | H | L | L | | | | | | | | | | | | | | | | | | REP.#1 | L | L | L | L | L | L | H | L | V12 < Vout < V13 |
| D0 | L | H | L | L | L | L | H | L | L | L | L | L | L | L | L | L | L | L | L | L | L | L | L | L | L | H | | L | L | L | L | L | L | H | L | V13 |
| D1 - DF | L | H | L | L | L | L | L | H | L | | | | | | | | | | | | | | | | | | REP.#2 | L | L | L | L | L | L | H | L | V13 < Vout < V14 |
| E0 | L | H | L | L | L | L | L | H | L | H | L | L | L | L | L | L | L | L | L | L | L | L | L | L | L | L | | L | L | L | L | L | L | H | L | V14 |
| E1 - EF | L | H | L | L | L | L | L | H | L | | | | | | | | | | | | | | | | | | REP.#1 | L | L | L | L | L | L | L | H | V14 < Vout < V15 |
| F0 | L | H | L | L | L | L | L | H | L | L | L | L | L | L | L | L | L | L | L | L | L | L | L | L | L | H | | L | L | L | L | L | L | L | H | V15 |
| F1 - FF | L | H | L | L | L | L | L | L | H | | | | | | | | | | | | | | | | | | REP.#2 | L | L | L | L | L | L | L | H | V15 < Vout < V16 |

PRIOR ART

IMAGE DISPLAY DEVICE AND THE DRIVER CIRCUIT THEREOF

CLAIM OF PRIORITY

The present application claims priority from Japanese application JP 2004-336950, filed on Nov. 22, 2004, the content of which is hereby incorporated by reference into this application.

FIELD OF THE INVENTION

The present invention relates to an image display device and the driver circuit thereof, and more particularly to an image display device wherein the square measure of a non-display area is reduced by narrowing the width of a data driver circuit arranged in the non-display area of the image display device, and the driver circuit thereof.

BACKGROUND OF THE INVENTION

In an active matrix type display, typically an active matrix type liquid crystal display, a thin film transistor (TFT) is formed in each pixel, and display information is stored on a pixel-by-pixel basis to display images. A TFT formed by using a polysilicon film which is fabricated by polycrystallization of an amorphous silicon film by laser annealing, with its mobility being raised to about 100 cm2/V·S is called a polysilicon TFT. Since a circuit configured of such polysilicon TFTs operates with signals of a few MHz to dozens of MHz, not only pixels but also a data driver circuit generating image signals and a driver circuit which has the scanning function of a gate driver circuit can be formed on the substrate of a liquid crystal display device or the like in the same process as the formation of the TFTs constituting the pixels.

The data driver circuit supplies an analog-signal voltage containing image signal information to a plurality of data lines. The data lines in this context are wires running in the vertical direction within the display screen of the image display device, and supply each pixel with an analog signal voltage.

The data driver circuit requires the following functions.

(1) A function to convert digital signals into analog voltages, namely the function of a DA converter. Where input image signals supplied from outside the image display device include many digital signals, it is preferable to build this function into the device.

(2) A function to distribute analog signal voltages. This is required because there are a plurality of data lines (usually as many as pixels in the horizontal direction of the frame).

FIG. 11 shows an example of configuration of a conventional data driver circuit. The data driver circuit comprises a decoder (DEC) 81, a shift register (SREG) 82 and a switch matrix 83. In the switch matrix 83, memory elements 84 each consisting of N-channel TFTs 85 and 86 and one capacitor 87 are arranged in a matrix form, and connected to one another by a plurality of decoded signal lines 88, a plurality of trigger lines 89, a plurality of reference voltage lines 90 and a plurality of output lines 91. The decoded signal lines 88 are connected to the output of the decoder 81, the trigger lines 89 to the shift register 82, the reference voltage lines 90 to external reference voltage lines Vref1 through Vrefx, and the output lines 91, to the data lines of the image display device.

The operation of the data driver circuit shown in FIG. 11 will be briefly described below. Digital image signals DSIG supplied from outside are decoded by the decoder 81, and supplied to the decoded signal lines 88. One of the decoded signal lines 88 relates to the entered digital image signal DSIG and takes on a sufficiently high voltage (hereinafter abbreviated to the H level) to turn ON the N-channel TFT, and the remaining ones take on a sufficiently low voltage (hereinafter abbreviated to the L level) to turn OFF the N-channel TFT. The shift register 82 successively raises one or another of the trigger lines 89 to the H level in synchronism with the input timings of the digital image signals DSIG.

On one column of the memory elements 84 connected to a trigger line 89 at the H level, as the TFT 85 is turned ON, the decoded signal on a decoded signal line 88 is latched into the capacitor 87. Out of the decoded signal lines 88, only one corresponding to the digital image signal DSIG is at the H level, and accordingly the capacitor 87 connected to that decode line samples the H level. Then, the TFT 86 to be connected to the capacitor 87 having sampled the H level is turned ON, and that TFT 86 selects one of the reference voltages Vref1 through Vrefx of the reference voltage lines 90 to be connected and outputs it to the output line 91. The reference voltage supplied to the output lines 91 is further fed to a data line of the image display device (not shown).

The operation described above causes the circuit of FIG. 11 (1) to convert digital image signals into corresponding voltage signals and (2) to distribute the voltage signals among the plurality of data lines, and is thereby enabled to perform its above-stated functions as a data driver circuit.

Examples of the circuit shown in FIG. 11 are also described in detail in Patent Document 1 and Patent Document 2. One of the features of the circuit shown in FIG. 11 is that, since the configuration requires merely the wiring of two lines per output in the longitudinal direction of the drawing, the circuit width per output can be narrowed, enabling the circuit to be applied to finer image display devices.

Patent Document 1: Japanese Patent Laid-Open No. 2003-005716

Patent Document 2: Japanese Patent Laid-Open No. 2004-085666

SUMMARY OF THE INVENTION

The conventional data driver circuit shown in FIG. 11 requires as many stages of the memory elements 84 constituting the switch matrix 83 in the longitudinal direction of the drawing as the number of display gradations. Therefore, when the number of bits of each digital image DSIG entered from outside is four, 16 stages, when the number of bits is six, 64 stages, or when the number of bits is eight, 256 stages are required. Thus, the required number of stages increases in proportion to the power of 2 by the number of bits, with a corresponding increase in the circuit width W1 of the switch matrix.

Especially where the number of gradations is eight or more, if the pitch of the memory elements 84 in the longitudinal direction of the drawing is 30 μm, the circuit width W of the switch matrix 83 by itself will occupy 7.68 mm. Since the circuit width W1 has to be accommodated in the non-display area of the image display device, a greater width W1 would invite an increase in the non-display area of the image display device, and this means a constraint to the freedom of designing the shape of products to be mounted on the image display device or an obstruction to achieving compactness because it occupies a large space in the device.

An object of the present invention, therefore, is to provide an image display device which enables the width of the data driver circuit arranged in its non-display area to be reduced to keep the non-display area smaller, and the driver circuit (data driver circuit) thereof.

Typical aspects of the present invention disclosed in this specification are summarized below.

(1) A driver circuit according to the invention, which is to be arranged in the peripheral part of an image display device, supplies in parallel a plurality of analog voltages corresponding to digital signals entered serially, and comprises first and second DA converters which convert the digital signals, in accordance with more significant bits thereof, into analog voltages; a voltage divider which, arranged in the gap between the first and second DA converters, divides the output voltages of the first and second DA converters in accordance with less significant bits of the digital signals; and a shift register which generates trigger signals in synchronism with the digital signals, wherein the voltage divider comprises decoders, memory elements arrayed in two-dimensional matrixes, and a plurality of resistive wirings; and the memory elements are so configured as to store decoded signals generated by the decoders in synchronism with the trigger signals, and selectively supply, in accordance with the decoded signals stored by the memory elements, the divided voltages which derive from the first and second DA converters and are generated on the resistive wirings.

(2) In an image display device according to the invention, the driver circuit according to (1) above, an image display unit comprising a plurality of pixel circuits and a plurality of data lines arranged in the image display unit to enter display signals into the pixel circuits are formed over one of paired substrates, and a liquid crystal is held between this substrate and the other of the paired substrates, the outputs of the driver circuit being fed to the data lines.

BRIEF DESCRIPTION OF THE DRAWINGS

FIG. 3 is a truth table of a decoder 1.

FIG. 4 is a truth table of a decoder DEC2.

FIG. 5 is a truth table of a decoder DEC3.

FIG. 6A is a split diagram showing the former half of the relationship between the outputs of the decoders DEC1 through DEC3 and output voltages of Y1 through Yn regarding digital input signals DSIG.

FIG. 6B is a split diagram showing the latter half of the relationship shown in FIG. 6A.

DETAILED DESCRIPTION OF THE PREFERRED EMBODIMENTS

Preferred embodiments of the image display device according to the present invention will be described in detail below with reference to accompanying drawings.

Embodiment 1

Figure 1:
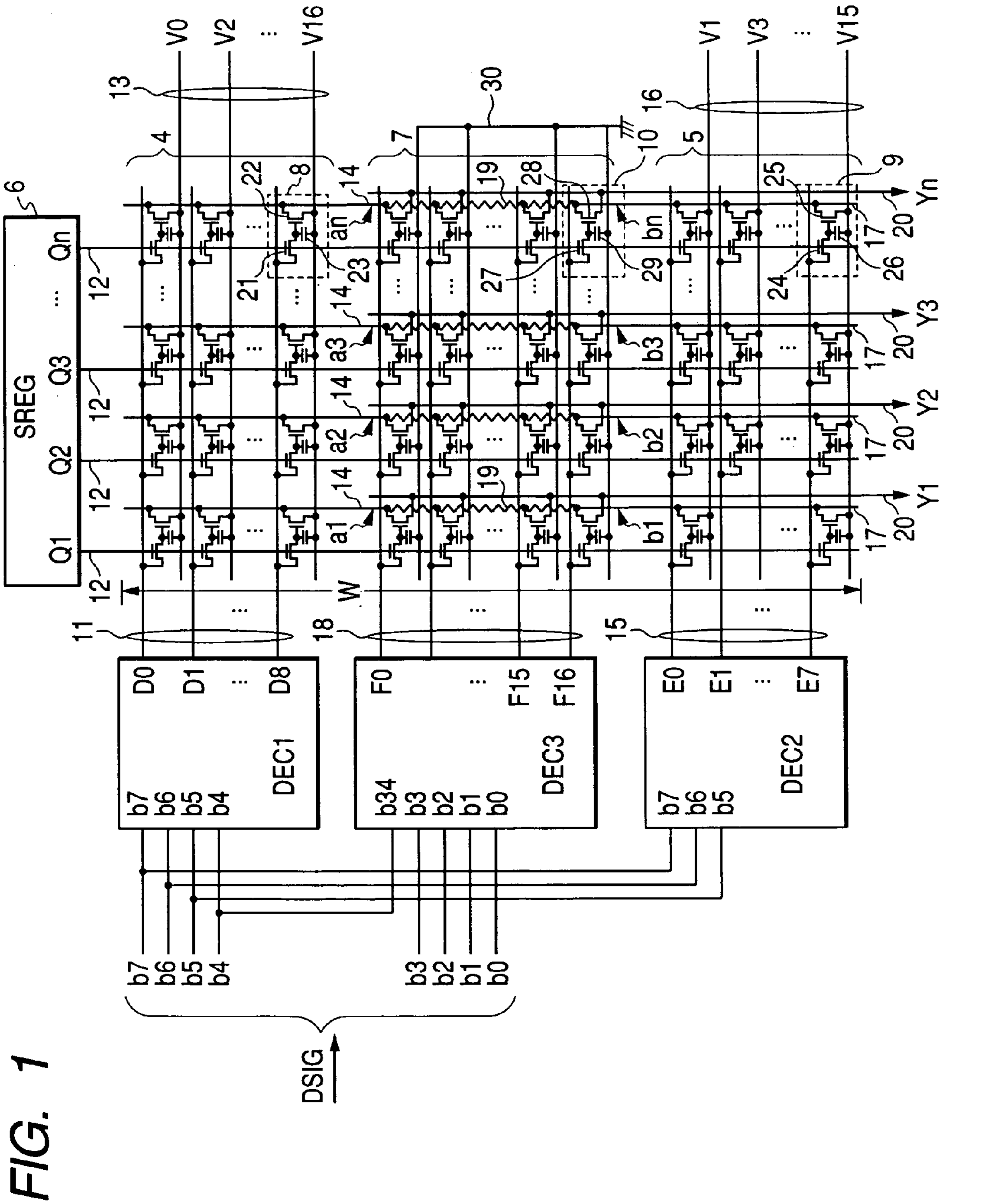
FIG. 1 shows a data driver circuit, which is a preferred embodiment of the present invention.

FIG. 1 shows the configuration of a data driver circuit according to the present invention. This embodiment of the invention is a data driver circuit having a resolution of eight bits. The data driver circuit of this embodiment comprises decoders DEC1 through DEC3, switch matrixes 4 and 5, a shift register (SREG) 6A and a switch matrix 7. The switch matrix 4 is configured by arranging memory elements 8 each composed of N-channel TFTs 21 and 22 and a capacitor 23 in a matrix of nine circuits in the longitudinal direction of the drawing by n circuits in the horizontal direction of the same, the elements being connected to one another by nine decoded signal lines 11, n trigger lines 12, nine reference voltage lines 13 and n output lines 14.

Similarly, the switch matrix 5 is configured by arranging memory elements 9 each composed of N-channel TFTs 24 and 25 and a capacitor 26 in a matrix of eight circuits in the longitudinal direction of the drawing by n circuits in the horizontal direction of the same, the elements being connected to one another by eight decoded signal lines 15, n trigger lines 12, eight reference voltage lines 16 and n output lines 17. The switch matrix 7 is configured by arranging memory elements 10 each composed of N-channel TFTs 27 and 28 and a capacitor 29 in a matrix of 17 circuits in the longitudinal direction of the drawing by n circuits in the horizontal direction of the same, the elements being connected to one another by 17 decoded signal lines 18, n trigger lines 12, n resistive wirings 19, n output lines 20 and a grounding line 30. The each number n of the memory elements 8 through 10 in the lateral direction of the drawing is variable in proportion to the resolution in the horizontal direction of the image display device to which the data driver circuit of this embodiment is applied.

Digital image signals DSIG (eight-bit binary signals: b7 through b0) are entered into the decoders DEC1 through DEC3 from outside. Four bits b7 through b4 are entered into the decoder DEC1, three bits b7 through b5 into the decoder DEC2, and five bits b4 through b0 into the decoder DEC3. Incidentally, b7 is the MSB and b0, the LSB. The nine decoded signal lines 11 connect outputs D0 through D8 of DEC1 to the switch matrix 4. The eight decoded signal lines 15 connect outputs E0 through E7 of DEC2 to the switch matrix 5. The 17 decoded signal lines 18 connect outputs F0 through F16 of DEC3 to the switch matrix 7.

The n trigger lines 12 connect outputs Q1 through Qn of the shift register 6 to the switch matrixes 4, 5 and 7. Seventeen different voltages consecutive from the reference voltages V0 through V16 are supplied to the reference voltage lines 13 and 16. Even-numbered voltages V0, V2, V4, V6, V8, V10, V12, V14 and V16 are supplied to the nine reference voltage lines 13, and odd-numbered voltages V1, V3, V5, V7, V9, V11, V13 and V15, to the eight reference voltage lines 16. The n output lines 14 and the n output lines 17 are connected to the two ends each of the n resistive wirings 19. The source electrodes of the TFTs 28 constituting one column of memory elements 10 connect one end of one resistive wiring 19 to the other end at equal intervals. The n output lines 20 connect the drain electrodes of the TFTs 28 constituting one column of memory elements 10, and at the same time wired to outside the data driver circuit, their farther ends being connected to data lines of an image display device (not shown).

Figure 2:
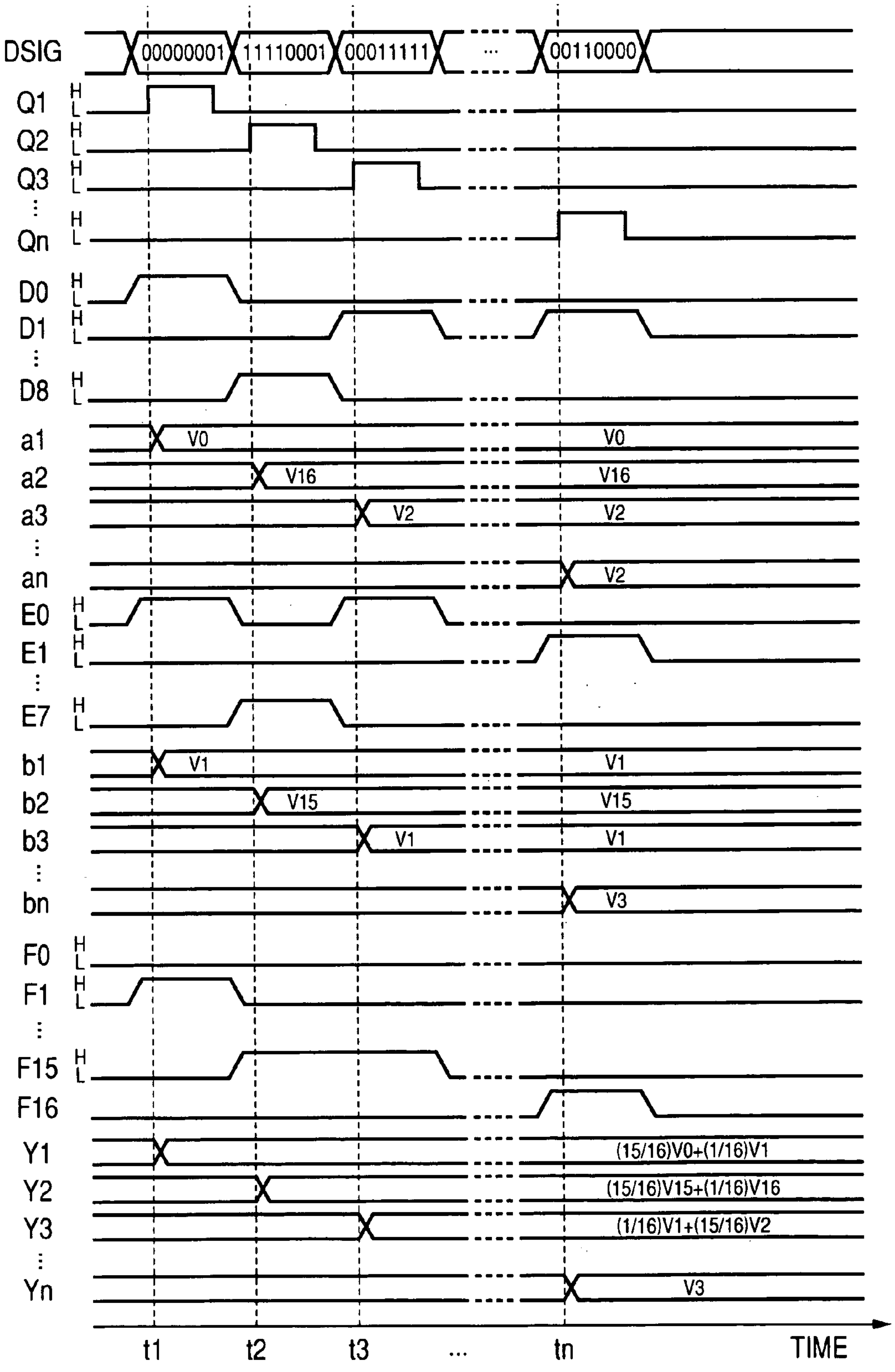
FIG. 2 is a chart of operational waveforms of the data driver circuit shown in FIG. 1.

FIG. 2 is a chart of operational waveforms of the data driver circuit show in FIG. 1. The number of digital signals DSIG entered in one round of operation in which the data driver circuit supplies analog voltages to all the outputs Y1 through Yn is n. In synchronism with the input timings of the digital signals DSIG, the shift register 6 successively generates trigger pulses of an H (high) level at the outputs Q1 through Qn. FIG. 2 illustrates, by way of example for describing the operation, a case in which the first digital image signal is "00000001", the second is "11110001", the third is "00011111" and then-this "00110000", all eight-bit binary numbers. DEC1 decodes digital image signals DSIG in accordance with a truth table shown in FIG. 3. DEC2 decodes digital image signals DSIG in accordance with another truth table shown in FIG. 4. Further, DEC3 decodes digital image signals DSIG in accordance with still another truth table shown in FIG. 5.

When the first digital image signal "00000001" is decoded by the decoders DEC1 through DEC3 in accordance with the respective truth tables, the decoded signal lines connected to the outputs D0, E0 and F1 take on the H level and the rest of the decoded signal lines, an L (low) level.

Generation of a trigger pulse of the H level at the output Q1 by the shift register 6 at a point of time t1 in synchronism with the first digital image signal causes the TFTs 21, 24 and 27 built into one column of memory elements 8 through 10, connected to the output Q1 of the shift register through the trigger lines 12, to be turned ON, and the voltages of the decoded signal lines 11, 15 and 18 are sampled into the capacitors 23, 26 and 29.

As the decoded signal lines connected to the outputs D0, E0 and F1 are at the H level then, the H level is sampled only for the capacitor 23 built into the memory element 8 positioned at the intersection of the trigger line 12 connected to the output Q1 and the decoded signal line 11 connected to the decoded output D0, the capacitor 26 built into the memory element 9 positioned at the intersection of the trigger line 12 connected to Q1 and the decoded signal line 15 connected to E0, and the capacitor 29 built into the memory element 10 positioned at the intersection of the trigger line 12 connected to Q1 and the decoded signal line 18 connected to F1, while the L level is sampled for all the rest. And only the TFTs 22, 25 and 28 connected to these three capacitors for which the H level is sampled are turned ON.

Then, the reference voltage V0 is supplied onto a node a1 on an output line 14, and the reference voltage V1, to a node b1 on an output line 17. The voltage V0 of the node a1 and the voltage V1 of the node b1 are divided by a resistive wiring 19. Connection of one column of memory elements 10 uniformly from one end of the resistive wiring 19 to the other end causes voltages equally divided by 16, including the voltage V0, (15/16)V0+(1/16)V1, . . . , (1/16)V0+(15/16)V1 and V1, to be supplied from the resistive wiring 19.

Since only the TFT 28 built into the memory element 10 positioned at the intersection of the trigger line 12 connected to the output Q1 of the shift register and the decoded signal line 18 connected to the output F1 of the decoder DEC3 is ON, the voltage of (15/16) V0+(1/16) V1 is selected and supplied to the output line 20 (Y1). A similar operation is repeated thereafter.

The second digital image signals "11110001" is entered and, in synchronism with it, the shift register 6 generates at the output Q2 a trigger pulse of the H level at a point of time t2. Then, the outputs D8, E7 and F15 of the decoders DEC1 through DEC3 take on the H level, and the H level is sampled only for the trigger line 12 connected to the output Q2 and memory elements 8 through 10 in positions intersecting it to turn ON the TFTs 22, 25 and 28. This causes the voltage V16 to be supplied to a node a2, the voltage V15 to a node b2, and the divided voltage (15/16)V15+(1/16)V16 of V16 to Y2.

After that, the third digital image signal "00011111" is entered and, in synchronism with it, the shift register 6 generates at the output Q3 a trigger pulse of the H level at a point of time t3. Then, the outputs D1, E0 and F15 of DEC1 through DEC3 take on the H level, and the H level is sampled only for the trigger line 12 connected to the output Q2 and the TFTs 22, 25 and 28 of the memory elements 8 through 10 in positions intersecting it to turn ON. This causes the voltage V2 to be supplied to a node a3, the voltage V1 to a node b3, and the divided voltage (1/16)V1+ (15/16)V2 of V1 and V2 to Y2.

Finally, the n-th digital image signal "00010000" is entered and, in synchronism with it, the shift register 6 generates at the output Q3 a trigger pulse of the H level at a point of time tn. Then, the outputs D1, E1 and F16 of DEC1 through DEC3 take on the H level, and the H level is sampled only for the trigger line 12 connected to the output Qn and the TFTs 22, 25 and 28 of the memory elements 8 through 10 in positions intersecting it to turn ON. This causes the voltage V2 to be supplied to a node an, and the voltage V3 to a node bn.

Incidentally, while voltage division is accomplished by a resistive wiring 19, when the output F0 of F16 of the decoder DEC3 is at the H level, the voltage at an end of the resistive wiring 19 is selected with the result that the voltage of either the node an or the node bn is directly supplied to Yn. In this case, since F16 is at the H level, the voltage of the node bn is directly supplied, and the voltage V3 is supplied to Yn.

The operation described above provides all the predetermined output voltages Vout for Y1 through Yn from the point of time tn onward, and they are fed to the data lines of the image display device. FIG. 6A and FIG. 6B show together the relationship between the outputs of the decoders DEC1 through DEC3 and the output voltages of Y1 through Yn regarding the digital input signals DSIG. The data of DSIG are stated in hexadecimal numbers. The data driver circuit of this embodiment can supply 256 levels of voltage to data 00 through FF of the eight-bit digital input signals DSIG. Incidentally, FIG. 6A shows data 00 through 1F of the digital input signals DSIG and FIG. 6B, data 20 through FF of DSIG. Further, "REP. #1" and "REP. #2" in FIG. 6B respectively indicate repetitions of the same H and L output patterns, namely "#1" and "#2", in FIG. 6A.

Figure 7:
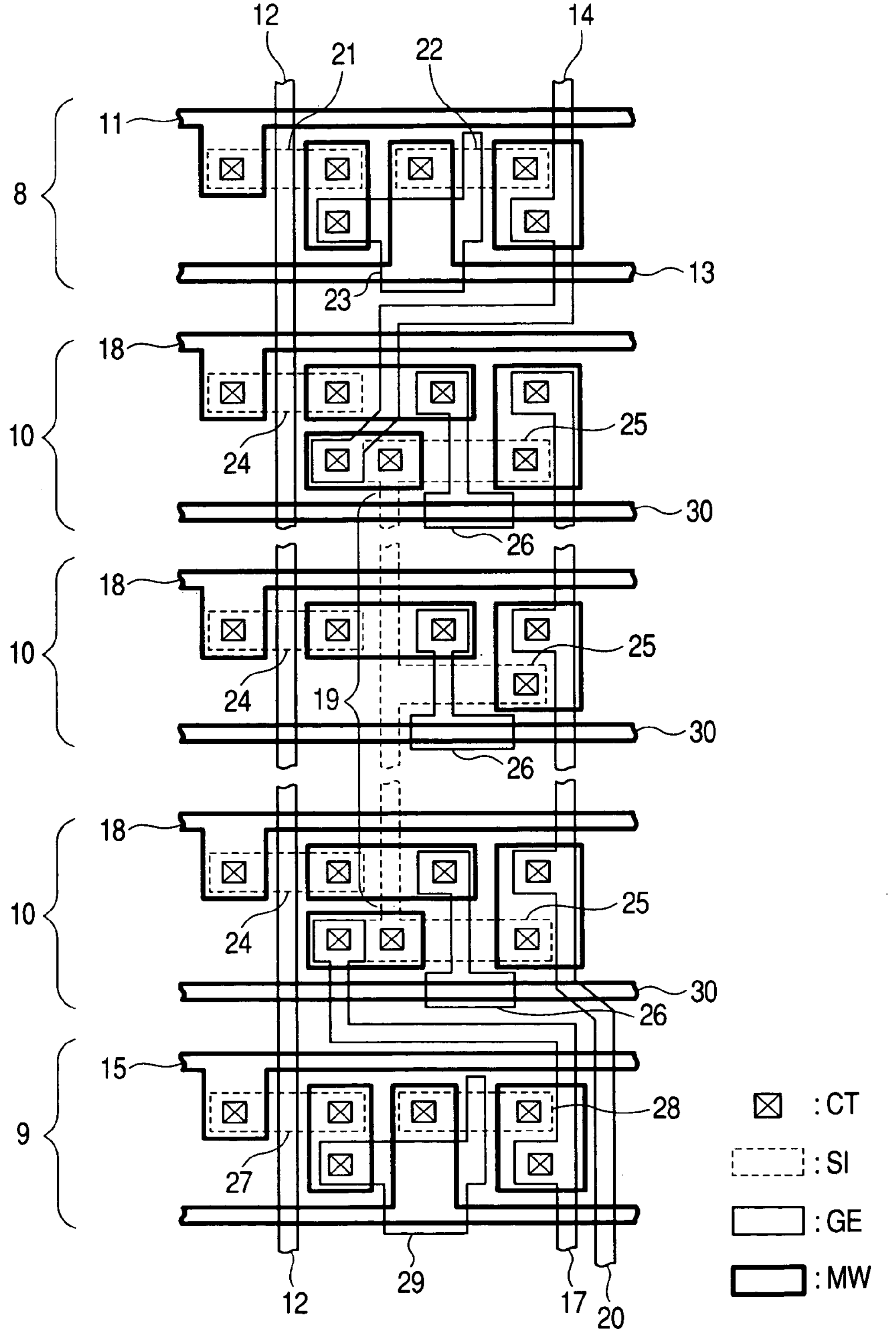
FIG. 7 shows an example of layout of memory elements.

FIG. 7 shows an example of layout of the memory elements 8 through 10. In this example of layout, the memory element 8 of the bottom level in the switch matrix 4, the memory element 10 of the top level of the switch matrix 7, a memory element 10 near the center, the memory element 10 of the bottom level and the memory element 9 of the top level of the switch matrix 5 are shown in that order.

The areas surrounded by broken lines represent the pattern of the silicon thin film layer (SI) of TFT, the areas surrounded by thin solid lines, that of the gate-metal layer (GT) of TFT, the small square pattern containing x, a contact hole (CT), and the areas surrounded by thick solid lines, the pattern of a metal wiring layer (MW). The TFTs 21, 22, 24, 25, 27 and 28 are formed at the intersections between the broken-line pattern of the silicon thin film layer and the thin solid-line pattern of the gate-metal layer. The silicon thin film layer is doped with phosphorus except in the vicinities of the intersection with the gate-metal layer, and each TFT is an N-channel TFT.

Further, the silicon thin film layer is long extended from the memory element 10 of the top level to the memory element 10 of the bottom level in the switch matrix 7 to form the resistive wirings 19. The gate-metal layer is used for the trigger lines 12 and the output lines 14, 17 and 20, all arranged in the longitudinal direction of the drawing.

The metal wiring layer is used for connecting the wirings around the source electrodes and drain electrodes of TFTs. The metal wiring layer is also used for the decoded signal lines 11, 15 and 18, the reference voltage lines 13 and 17, and the grounding line 30 arranged in the lateral direction of the drawing. Further, the metal wiring layer forms the capacitors 23, 26 and 29 by overlapping the gate-metal layer with an interlayer insulating film in-between.

Although all the TFTs referred to in FIG. 1 and FIG. 7 are N-channel TFTs, P-channel TFTs can be used instead in this configuration. In this case, the silicon thin film layer should be doped with boron, in place of phosphorus, except in its intersections with the gate-metal layer. Further, the H level should be rewritten to mean a low enough voltage to turn the P-channel TFTs ON and the L level, to mean a high enough voltage to turn the P-channel TFTs OFF.

Figure 11:
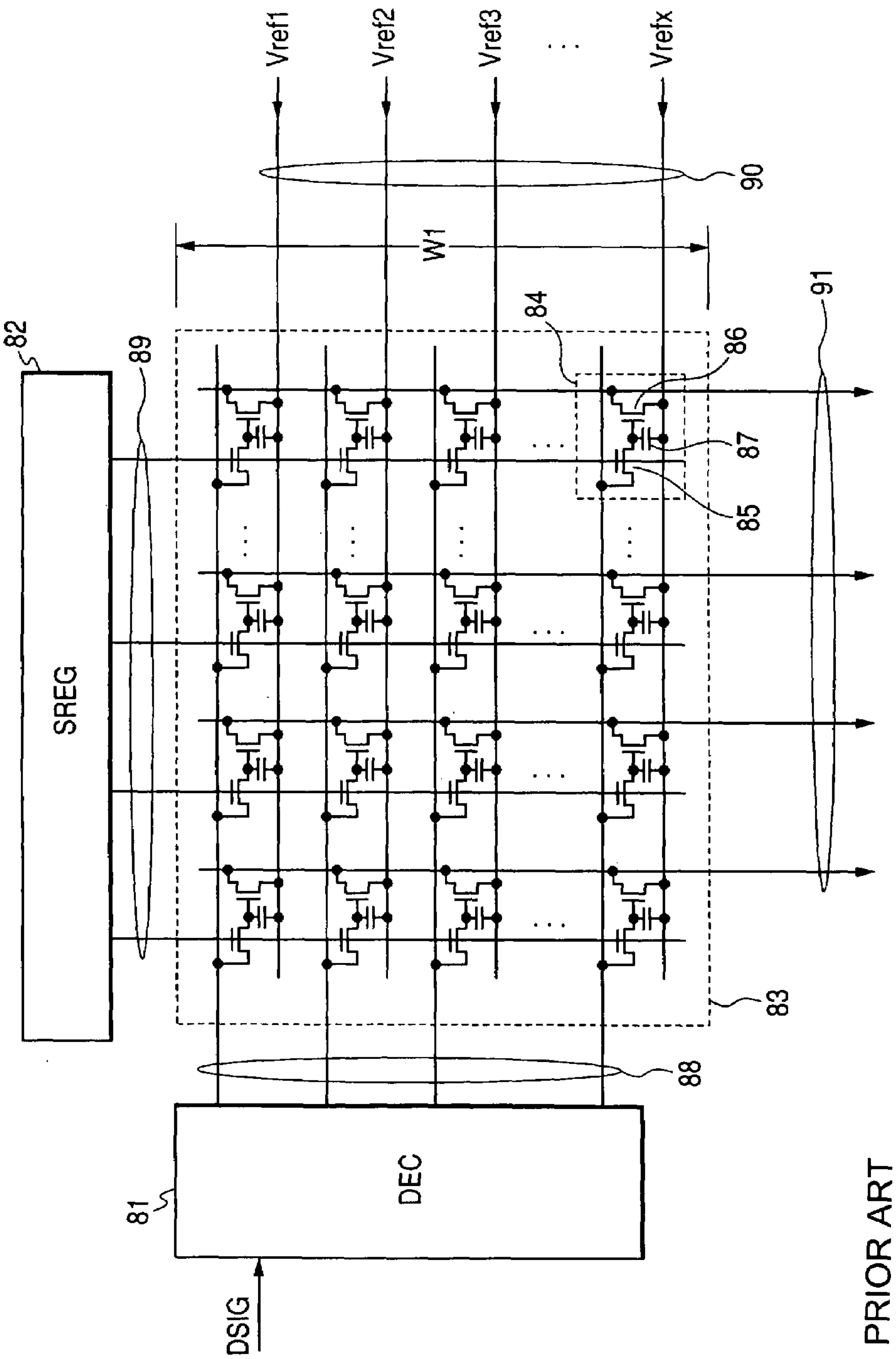
FIG. 11 shows an example of configuration of a conventional data driver circuit.

The summation W of the widths of the switch matrixes constituting the data driver circuit of this embodiment corresponds to about 13.3% of the width W1 of the switch matrix constituting the conventional data driver circuit shown in FIG. 11, a factor contributing to realizing a more compact data driver circuit. The summation W of the widths of the switch matrixes is reduced to about 13% of W1 for the following two reasons.

(1) While the number of revolutions of the memory elements 84 constituting the switch matrix 83 is 256 in the longitudinal direction of the drawing in the example of conventional data driver circuit shown in FIG. 11, the summation of the numbers of the memory elements 8 through 10 constituting the switch matrixes 4, 5 and 7 in the data driver circuit, which is this embodiment of the invention shown in FIG. 1, is 9+8+17=34 in the longitudinal direction of the drawing, and the ratio between these numbers is 34/256≈13.3.

(2) The memory elements 84 included in the conventional data driver circuit and the memory elements 8 through 10 included in the data driver circuit of this embodiment are substantially equal in layout pattern size. As shown in FIG. 7, the memory elements 8 through 10 are substantially equal in size between the lateral direction of the drawing and the longitudinal direction of the drawing, because each of the memory elements 8 through 10 is composed of two TFTs, one capacitor and wirings, which are connected to the TFTs and the capacitor, in the longitudinal direction and the lateral direction and accordingly the elements take on similar layout patterns. Further, since the memory elements 84 have the same circuit configuration as the memory elements 8, the memory elements 84 can be configured in the same layout pattern as the memory elements 8.

Regarding the number of lines per output of wiring in the longitudinal direction of the drawing on the other hand, while it is two in the conventional data driver circuit, it is at most three including resistive wiring in the data driver circuit of this embodiment, and this is a disadvantage compared with the conventional circuit in terms of making the circuitry finer because the spacing between output lines is expanded as much as the width of the layout pattern constituting one wiring. However, the number of lines of wiring in the longitudinal direction is minimized to three where the switch matrix 7 is arranged between the switch matrixes 4 and 5 as in this embodiment, and the number of lines of wiring in the longitudinal direction of the drawing is four or more in all other arrangements.

Figure 8:
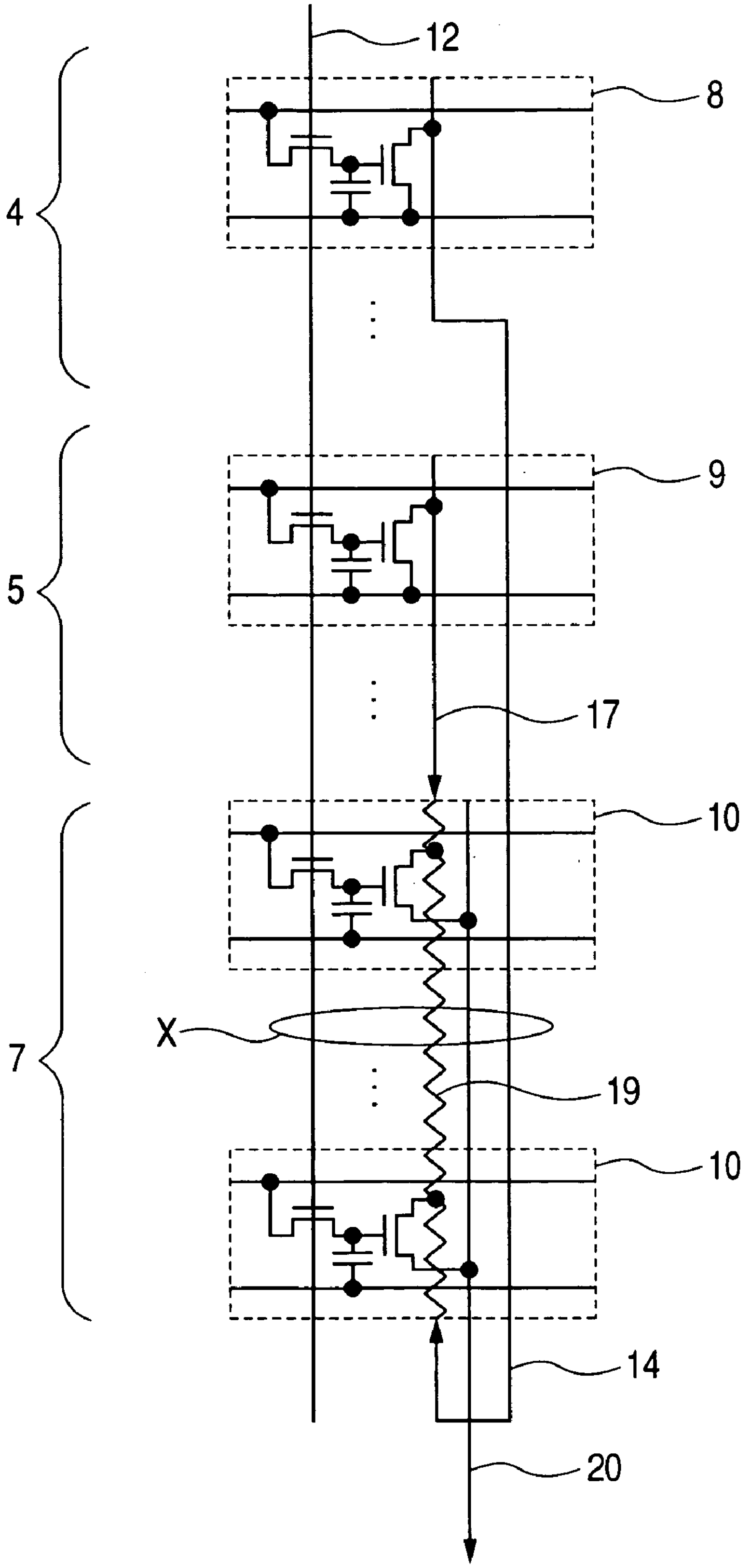
FIG. 8 shows a case in which a switch matrix 7 is arranged elsewhere than between switch matrixes 4 and 5.

FIG. 8 shows a case in which a switch matrix 7 is arranged elsewhere than between switch matrixes 4 and 5. To the two ends of each of the resistive wirings 19 contained in the switch matrix 7, the output lines 14 of the switch matrix 4 and the output line 17 of the switch matrix 5 are connected. Then in this arrangement, it is absolutely necessary for either the output line 14 or the output line 17 to cross the memory elements 10. Therefore, the wirings in the vicinities of any memory element 10 comprise a trigger line 12, an output line 20, a resistive wiring 19 and either an output line 14 or an output line 17, the number of lines is four. Accordingly, it is desirable to arrange the switch matrix 7 between the switch matrixes 4 and 5 as in the embodiment shown in FIG. 1.

Embodiment 2

Figure 9:
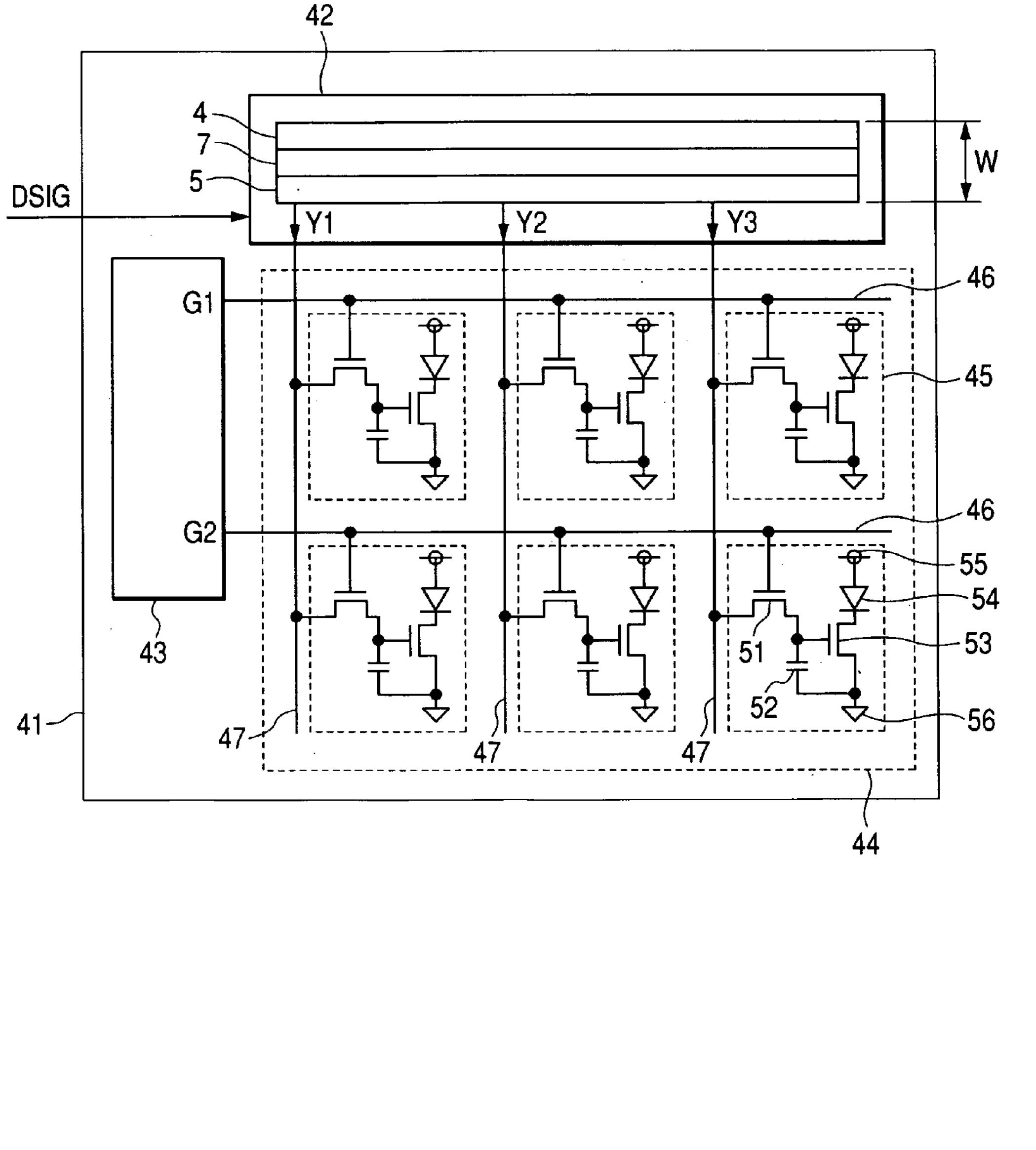
FIG. 9 shows an embodiment of light-emitting type image display device using the data driver circuit of FIG. 1.

FIG. 9 shows an embodiment of light-emitting type image display device using the data driver circuit of FIG. 1. Over a glass substrate 41, a data driver circuit 42 of the configuration shown in FIG. 1, a gate driver circuit 43 and a display area 44 are formed. The data driver circuit 42 comprises switch matrixes 4, 5 and 7, which are arranged in the same directions, both longitudinal and lateral, as in FIG. 1. In the display area 44, a plurality of data lines 47 and a plurality of gate lines 46 are arranged in the longitudinal and lateral directions, respectively, and a pixel circuit 45 is arranged at each of their intersections. Although the example shown in FIG. 9 is supposed to have only three data lines, two gate lines and 3×2=6 pixel circuits 45 for the sake of brevity of description, an actual image display device has hundreds each of them. For instance a color image display device of VGA resolution has 640×3(RGB)=1920 data lines 47, 480 gate lines 46 and 640×3×480=921600 pixel circuits 45. Each of the pixel circuits 45 comprises N-channel TFTs 51 and 53, a capacitor 52, a light-emitting diode element 54, an anode power supply 55 and a cathode power supply 56.

The image display device of FIG. 9 displays an image by the operation to be described below. The data driver circuit 42, to which externally supplied digital image signals DSIG are entered, supplies analog voltages corresponding to the digital image signals DSIG at outputs Y1 through Y3 and data lines 47 connected to them. The gate driver circuit 43 successively generates trigger pulses at G1 and G2 in synchronism with the converting operation of the data driver circuit 42. The gate electrode of the TFT 51 built into each pixel circuit 45 is connected to the output G1 or G2 of the gate driver circuit 43 through a gate line 46, and the TFT 51 samples the voltage of the data line 47 into the capacitor 52 in response to a trigger pulse generated by the gate driver circuit 43.

In the first round of converting operation by the data driver circuit 42, the generation of a trigger pulse by the gate driver circuit 43 at the output G1 causes the analog voltage supplied to Y1 through Y3 to be sampled into the capacitor 52 built into the pixel circuit 45 on the first row. In the second round of converting operation by the data driver circuit 42, the generation of a trigger pulse by the gate driver circuit 43 at the output G2 causes the analog voltage supplied to Y1 through Y3 to be sampled into the capacitor 52 built into the pixel circuit 45 on the second row.

As the sampled voltage is applied between the gate electrode and the source electrode of the TFT 53, the TFT 53 controls the current flowing to the light-emitting diode element 54 in accordance with the voltage sampled into the capacitor 52. The luminescence intensity of the light-emitting diode element 54 varies in proportion to that current. As a light-emitting diode element whose luminescence intensity is proportional to the current, an organic electroluminescence element can be used.

Since the luminescence intensity of the light-emitting diode element 54 built into every pixel circuit 45 can be controlled in accordance with the digital image input signal DSIG, the image display device of FIG. 9 can display images.

In the embodiment of FIG. 9, the data driver circuit 42 is arranged outside the display area 44, namely in a non-display area. As the summation W of the circuit widths of the switch matrixes 4, 5 and 7 is therefore reduced to 13.3% of the circuit width W1 of the switch matrix of the conventional data driver circuit, the square measure of the non-display area of this embodiment can be made smaller than where the conventional data driver circuit is used.

Embodiment 3

Figure 10:
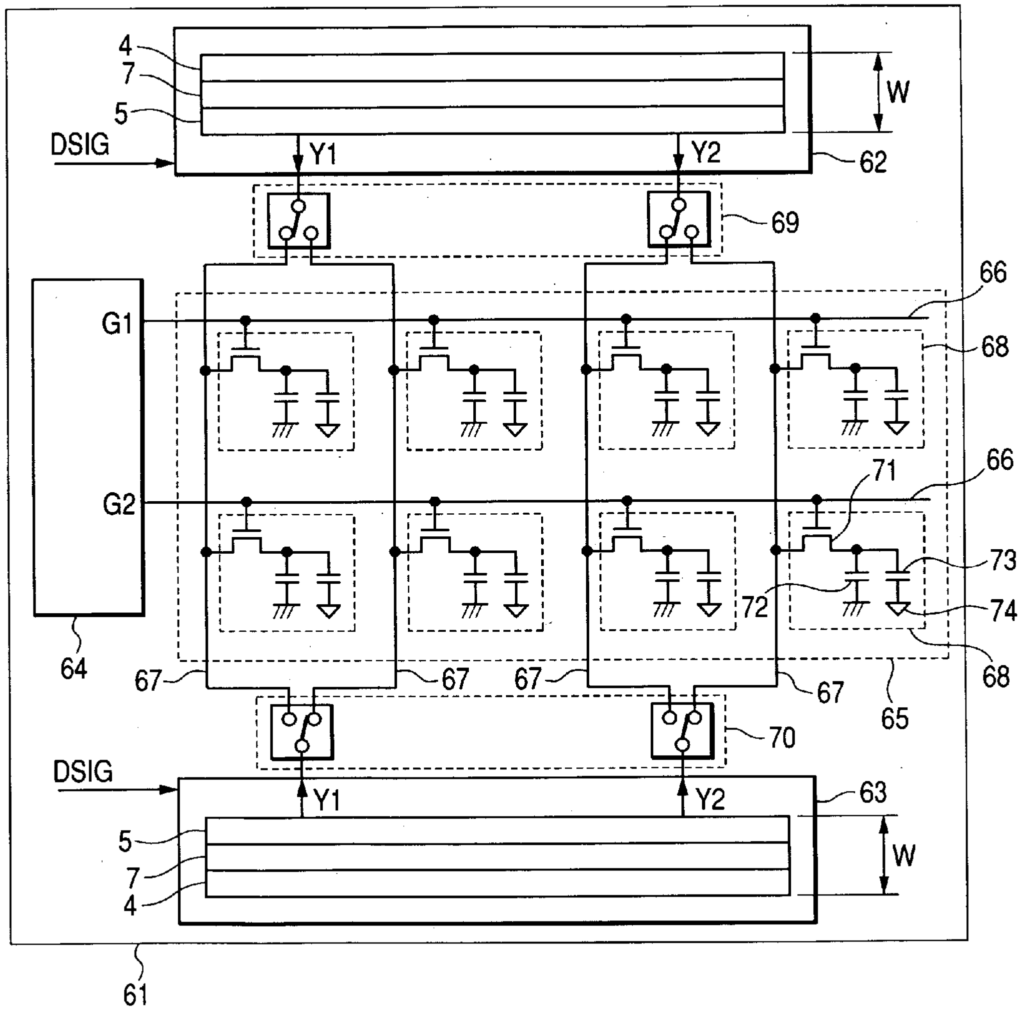
FIG. 10 shows an embodiment of liquid crystal image display device using the data driver circuit of FIG. 1.

FIG. 10 shows an embodiment of liquid crystal image display device using the data driver circuit of FIG. 1. Over a glass substrate 61, data driver circuits 62 and 63 of FIG. 1, a gate driver circuit 64, a display area 65, and demultiplexers 69 and 70 are formed. The data driver circuit 62 comprises the switch matrixes 4, 5 and 7, which are arranged in the same directions, both longitudinal and lateral, as in FIG. 1. The data driver circuit 63 also comprises the switch matrixes 4, 5 and 7, but they are arranged in directions inverted longitudinally from the corresponding directions in FIG. 1.

In the display area 65, a plurality of data lines 67 and a plurality of gate lines 66 are arranged in the longitudinal and lateral directions, respectively, and a pixel circuit 68 is arranged at each of their intersections.

Although the example shown in FIG. 10 is supposed to have only four data lines, two gate lines and 4×2=8 pixel circuits 68 for the sake of brevity of description, an actual image display device has hundreds each of them. For instance a color image display device of VGA resolution has 640×3(RGB)=1920 data lines 67, 480 gate lines 66 and 640×3×480=921600 pixel circuits 68. Each of the pixel circuits 68 comprises an N-channel TFT 71, a capacitor 72, and a liquid crystal element 73.

Though not shown in the drawing, another glass substrate over which a transparent common electrode 74 is superposed over the glass substrate 61 and, by having a liquid crystal material held between them, the liquid crystal element 73 is formed. Onto the external surface of each of these two glass substrates, a polarizing film is stuck. According to the voltage applied to the liquid crystal element 73, the orientation of the liquid crystal molecules in the liquid crystal element 73 varies to control the intensity of the light transmitted by the liquid crystal element 73 and the two polarizing films.

The liquid crystal image display device shown in FIG. 10 displays images by the operation to be described below. The data driver circuits 62 and 63, to which externally supplied digital image signals DSIG are entered, supply analog voltages corresponding to the digital image signals DSIG to the demultiplexers 69 and 70 connected to the outputs Y1 and Y2.

For the purpose of causing the voltage applied to the liquid crystal element 73 to alternate, the reference voltage supplied to the data driver circuit 62 is higher than the potential of a common electrode 74 formed over the other superposed glass substrate and opposed to the glass substrate 61 (hereinafter referred to as the opposed electrode 74), while the reference voltage supplied to the data driver circuit 63 is lower than the potential of the opposed electrode 74. The output voltages of these data driver circuits 62 and 63 are distributed by the demultiplexers 69 and 70 to odd-numbered and even-numbered data lines 67.

The gate driver circuit 64 successively generates trigger pulses at G1 and G2 in synchronism with the converting operation of the data driver circuits 62 and 63. The gate electrode of the TFT 71 built into each pixel circuit 68 is connected to the output G1 or G2 of the gate driver circuit 64 through a gate line 66, and the TFT 71 samples into the capacitor 72 the voltage of the data line 67 in response to a trigger pulse generated by the gate driver circuit 64.

In the first round of converting operation by the data driver circuits 62 and 63, the generation of a trigger pulse by the gate driver circuit 64 at the output G1 causes the analog voltage supplied to Y1 and Y2 to be sampled into the capacitor 72 built into the pixel circuit 68 on the first row. In the second round of converting operation by the data driver circuits 62 and 63, the generation of a trigger pulse by the gate driver circuit 64 at the output G2 causes the analog voltage supplied to Y1 and Y2 and to be sampled into the capacitor 72 built into the pixel circuit 68 on the second row.

The sampled voltage is applied to the liquid crystal element 73 to control the intensity of the light transmitted by the liquid crystal element 73. By switching between the demultiplexers 69 and 70, the voltage applied to the liquid crystal element 73 built into each pixel circuit 68 can be caused to alternate. It is preferable for the timing of switching to match the horizontal blanking period or the vertical blanking period of the entered digital image signals DSIG.

Since the intensity of the light transmitted by the liquid crystal element 73 built into every pixel circuit 68 can be controlled in accordance with the digital image signals, the liquid crystal image display device shown in FIG. 10 can display images.

In the embodiment shown in FIG. 10, the data driver circuits 62 and 63 are arranged outside the display area 65, namely in a non-display area. As the summation W of the circuit widths of the switch matrixes 4, 5 and 7 is therefore reduced to 13.3% of the circuit width W1 of the switch matrix of the conventional data driver circuit, the square measure of the non-display area of this embodiment can be made smaller than where the conventional data driver circuit is used.

According to the present invention, since the non-display area of the image display device can be kept smaller in spite of an increase in the number of display gradations, the freedom of designing the shape of products to be mounted on the image display device is increased and, as the space occupied in the product is reduced, the product can be made more compact.

What is claimed is:

1. A driver circuit which, arranged in the peripheral part of an image display device, supplies in parallel a plurality of analog voltages corresponding to digital signals entered serially, comprising:

first and second DA converters which convert said digital signals, in accordance with more significant bits thereof, into analog voltages;

a voltage divider which, arranged in the gap between said first and second DA converters, divides the output voltages of said first and second DA converters in accordance with less significant bits of said digital signals; and a shift register which generates trigger signals in synchronism with said digital signals, wherein:

said voltage divider comprises decoders, memory elements arrayed in two-dimensional matrixes, and a plurality of resistive wirings; and said memory elements are so configured as to store decoded signals generated by said decoders in synchronism with said trigger signals, and selectively supply, in accordance with the decoded signals stored by said memory elements, the divided voltages which derive from said first and second DA converters and are generated on said resistive wirings.

2. The driver circuit according to claim 1, wherein:

said first and second DA converters comprise decoders and memory elements arrayed in two-dimensional matrixes, the memory elements are so configured as to store decoded signals generated by said decoders in synchronism with said trigger signals, and selectively supply, in accordance with the decoded signals stored by said memory elements, reference voltages fed from outside.

3. An image display device wherein the driver circuit according to claim 1, an image display unit comprising a plurality of pixel circuits and a plurality of data lines arranged in said image display unit to enter display signals into said pixel circuits are formed over one of paired substrates, and a liquid crystal is held between this substrate and the other of said paired substrates, the outputs of said driver circuit being fed to said data lines.

4. An image display device wherein the driver circuit according to claim 1, an image display unit comprising a plurality of pixel circuits and a plurality of data lines arranged in said image display unit to enter display signals into said pixel circuits are formed over a substrate, and a light-emitting element is formed over each of said pixel circuits, the outputs of said driver circuit being fed to said data lines.

5. The driver circuit according to claim 1, wherein:

said driver circuit comprises thin film transistors.

6. The driver circuit according to claim 5, wherein:

said resistive wirings are formed in the same layer as the silicon film constituting the source electrodes and drain electrodes of said thin film transistors.

7. The driver circuit according to claim 1, further comprising:

a plurality of trigger lines for conveying said trigger signals to said memory elements and a plurality of decoded signal lines for conveying said decoded signals to said memory elements, wherein:

said plurality of trigger lines and said plurality of decoded signal lines are arranged in a grid form, and one of said memory elements is arranged at each intersection thereof.

8. The driver circuit according to claim 7, wherein:

said resistive wirings are arranged in a direction parallel to said trigger lines.

9. The driver circuit according to claim 7, wherein:

each of said memory elements comprises a capacitor for storing said decoded signals, a first switch for sampling said decoded signals, and a second switch for selectively supplying the voltages of said resistive wirings according to the voltage held by said capacitor.

10. The driver circuit according to claim 9, wherein:

said first and second switches comprise N-channel thin film transistors or P-channel thin film transistors.

* * * * *